(12) United States Patent
Adduci et al.

(10) Patent No.: US 7,541,869 B2
(45) Date of Patent: Jun. 2, 2009

(54) FEEDBACK AMPLIFIER

(75) Inventors: Pietro Mario Adduci, Settimo Milanese (IT); Edoardo Botti, Vigevano (IT)

(73) Assignee: STMicroelecronics S.r.l., Agrate Brianza (MI) (IT)

( * ) Notice: Subject to any disclaimer, the term of this patent is extended or adjusted under 35 U.S.C. 154(b) by 134 days.

(21) Appl. No.: 11/692,597

(22) Filed: Mar. 28, 2007

(65) Prior Publication Data
US 2007/0229155 A1    Oct. 4, 2007

(30) Foreign Application Priority Data
Mar. 29, 2006    (EP) .................................. 06425213

(51) Int. Cl.
*H03F 3/217*    (2006.01)
(52) U.S. Cl. ............................. 330/251; 330/10; 330/99
(58) Field of Classification Search ................. 330/251, 330/10, 99
See application file for complete search history.

(56) References Cited

U.S. PATENT DOCUMENTS

| 4,456,872 | A | 6/1984 | Froeschle | 323/286 |
|---|---|---|---|---|
| 6,297,692 | B1 * | 10/2001 | Nielsen | 330/10 |
| 6,414,560 | B2 * | 7/2002 | Delano | 332/107 |
| 6,476,673 | B2 * | 11/2002 | Takagishi | 330/10 |
| 7,002,406 | B2 * | 2/2006 | Risbo et al. | 330/10 |
| 7,391,257 | B1 * | 6/2008 | Denison et al. | 330/9 |

FOREIGN PATENT DOCUMENTS

| EP | 1630954 | 3/2006 |
|---|---|---|
| WO | WO2004047286 | 6/2004 |
| WO | WO2004/100356 | 11/2004 |

OTHER PUBLICATIONS

"A Novel Audio Power Amplifier Topology with High Efficiency and State-of-the-Art Performance", Frederiksen et al., 109th AES Convention, Sep. 22-25, 2000, Los Angeles, CA USA, 26 pages.
"High Fidelity Pulse Width Amplifiers based on Novel Double Loop Feedback Techniques", Anderskouv et al., 100th AES Convention, May 11-14, 1996, Copenhagen, 18 pages.
"An Asynchronous Switching High-End Power Amplifier", vane der Hulst et al., 112th AES Convention, May 10-13, 2002, Munich, Germany, 6 pages.
"Small-Signal Modeling of Pulse-Width Modulated Switched-Mode Power Converters", Middlebrook, Proceedings of the IEEE, vol. 76, pp. 343-354, No. 4., Apr. 1988.

* cited by examiner

*Primary Examiner*—Patricia Nguyen
(74) *Attorney, Agent, or Firm*—Lisa K. Jorgenson; Allen, Dyer, Doppelt, Milbrath & Gilchrist, P.A.

(57) ABSTRACT

A feedback architecture for a PWM switching audio amplifier is, capable of compensating the effects of the demodulation filter through at least two feedback paths of the voltage applied to a load without degrading the overall loop gain of the device. Each of the feedback paths may include a respective network or filter for compensating a respective frequency pole of the cascade low-pass filter+load and establishing a certain band pass. These networks or filters may be passive networks.

12 Claims, 15 Drawing Sheets

FEEDBACK AMPLIFIER

FIELD OF THE INVENTION

This invention relates to electronic amplifiers and more particularly to a feedback amplifier in which a class D amplifier and a low-pass filter connected in cascade thereto are fedback through two feedback loops of the voltage signal supplied to a load.

BACKGROUND OF THE INVENTION

It is becoming even more difficult to realize high power linear amplifiers of relatively small size with an ever increasing number of channels to be amplified. Class D amplifiers are widely used because they are characterized by a relatively small power consumption and reduced size and weight. One of the drawbacks due to the use of a class D audio amplifier is the need of interposing between the power stage and the loudspeaker a filter for extracting the low-frequency spectral content (from about 20 Hz to about 20 kHz) from the output of the power stage.

The functioning principle of a class D amplifier consists in modulating a carrier of a frequency $f_c$ with a signal to be amplified of frequency $f_s$ much smaller than $f_c$, and in demodulating the output signal generated by the power stage. A possible modulation appropriate for this objective is the PWM modulation (Pulse Width Modulation), to which reference will be made hereinafter. In this case, the modulated signal is a square wave with a fixed frequency and duty-cycle adjusted in function of the signal to be amplified.

As shown in FIG. 1, the information content relative to the amplified signal may then be extracted from the PWM modulated signal by a low-pass LC passive filter (called also demodulation filter). Preferably, a snubber network $S_N$ is connected in parallel to the load such to reduce the load voltage ripple. The core of inductors for audio filtering applications is of a material having a non-negligible hysteresis, therefore the value of the inductance L varies and depends on the current that flows through the winding. This phenomenon is even more evident when the core is relatively small (low cost).

Therefore, the filtering operation introduces a nonlinearity that directly influences the amplified signal. As a consequence, the THD (Total Harmonic Distortion) of a class D amplifier is strongly influenced by the performance of the demodulation filter, because the filter is one of the main sources of distortion in switching amplifiers.

Moreover, the LC filter is connected in series to the load and interferes with the direct control of the amplifier of the loudspeaker making the frequency response depend from the load, as shown in the Bode diagrams of FIG. 2. The frequency response becomes even less regular when the loads, such as loudspeakers, are not purely resistive.

In order to prevent a modulation of the frequency response in function of the load, it may be preferable to choose a cut-off frequency $f_T$ of the cascade low-pass filter+load larger than 20 kHz. In general the cut-off frequency $f_T$ is always chosen as a compromise between the need of dampening high frequency components of the output signals generated by the power stage and the requisite of the largest possible frequency response.

The possibility of introducing a filter inside a feedback loop may allow a reduction of the output harmonic distortion by compensating eventual nonlinearities introduced by the filter, or may allow a reduction of the costs of the reactive elements of the filter (a cost that in practice may be close to the cost of the whole amplifier), thus keeping unchanged the THD of the whole system. Moreover, by introducing a feedback of the output of the filter an enhanced control of the frequency response of the amplifier on the load may be expected, thus making it less sensible or sensitive to load variations.

However, feedbacking the system in a classic manner by using the output of the filter, as shown in FIG. 3, would be a hardly affordable way because of the strong outphasing introduced by the LC pair that imposes a relevant reduction of the loop gain of the circuit in order to stabilize the system. As a consequence, this solution may not be capable of reducing distortion nor capable of widening the frequency response.

Several feedback amplifiers are described in literature. U.S. Pat. No. 4,456,872 discloses a switching amplifier that has a voltage and a current feedback loop. The presence of a feedback current complicates the circuit structure and uses a current sensor that increases fabrication costs of the system.

The article, "A Novel Audio Power Amplifier Topology with High Efficiency and State-of-the-Art Perform", by T. Frederiksen, H. Bengtsson and K. Nielsen, 109$^{th}$ AES Convention, 2000 Sep. 22-25, Los Angeles, Calif., USA, discloses a switched power audio amplifier with at least two feedback paths, one of which is connected directly to the output of the power stage according to a COM (Controlled Oscillation Modulator) technique. The presence of a feedback at the output of the power stage generates aliasing that, generally speaking, degrades the linearity performances of the system. Moreover, the functioning is based on a self-oscillating circuit (the input signal modulates the duty-cycle of the square wave at the output of the oscillator) with a variable oscillation frequency. This characteristic may degrade the system from the point of view of the EMI (ElectroMagnetic Interference) and makes difficult the synchronization of other signals with the oscillation frequency of the circuit.

The article, "High Fidelity Pulse Width Modulation Amplifiers based on Novel Double Loop Feedback Techniques", by N. Anderskouv, K. Nielsen, M. A. E. Denmark, 100$^{th}$ AES Convention, 1996 May 11-14, Copenhagen, discloses a power audio amplifier with a voltage feedback loop and a current feedback loop, Besides the drawbacks due to the presence of the previously mentioned current feedback, the loop gain is unsatisfactory.

The article, "An Asynchronous switching high-end power amplifier", by P. van der Hulst, A. Veltman e R. Groeneberg, 112$^{th}$ AES Convention, 2000 May 10-13, Munich, Germany, discloses a switching power amplifier with current feedback that is affected by the above mentioned drawbacks due to the current feedback.

SUMMARY OF THE INVENTION

A new architecture of a feedback amplifier that may be easy to realize and may solve the above mentioned problems of distortion and worsening of the frequency response, due to the presence of the demodulation low-pass filter has now been found.

A new feedback architecture is provided for a PWM switching audio amplifier, capable of compensating the effects of the demodulation filter through at least two feedback paths of the voltage applied to a load without the overall loop gain of the device. Each of the feedback paths includes a respective network (or filter) for compensating a respective frequency pole of the cascade low-pass filter+load and establishing a certain band pass.

According to an embodiment, these networks (or filters) are passive networks. The feedback amplifier may allow for further reduction of the distortion because the feedback signal that is output by the low-pass demodulation filter, in cascade to the class D amplifier. This is different from the prior art amplifiers that feedback a signal that occupies an unlimited band generated from the power stage (that is the class D amplifier), thus generating aliasing phenomena that degrades the linearity performance of the circuit.

Moreover, the proposed architecture may allow, with the same pass band of known amplifiers, reduction of the high frequency voltage ripple on the supplied load significantly lowering electromagnetic emissions.

BRIEF DESCRIPTION OF THE DRAWINGS

The invention will be described referring to the attached drawings, wherein:

FIG. 12b shows the Bode diagram of the transfer function $V_{out}/V_x$ of the loop of FIG. 12a;

DETAILED DESCRIPTION OF THE PREFERRED EMBODIMENTS

Indeed, the demodulation filter introduces a phase shift that may make the system unstable if a simple feedback is adopted. This problem may be effectively eliminated by realizing at least two feedback paths with each loop comprising at least a filter for compensating the poles of the low-pass demodulation filter and fixing (generally, widening) the pass band of the amplifier.

Figure 4:
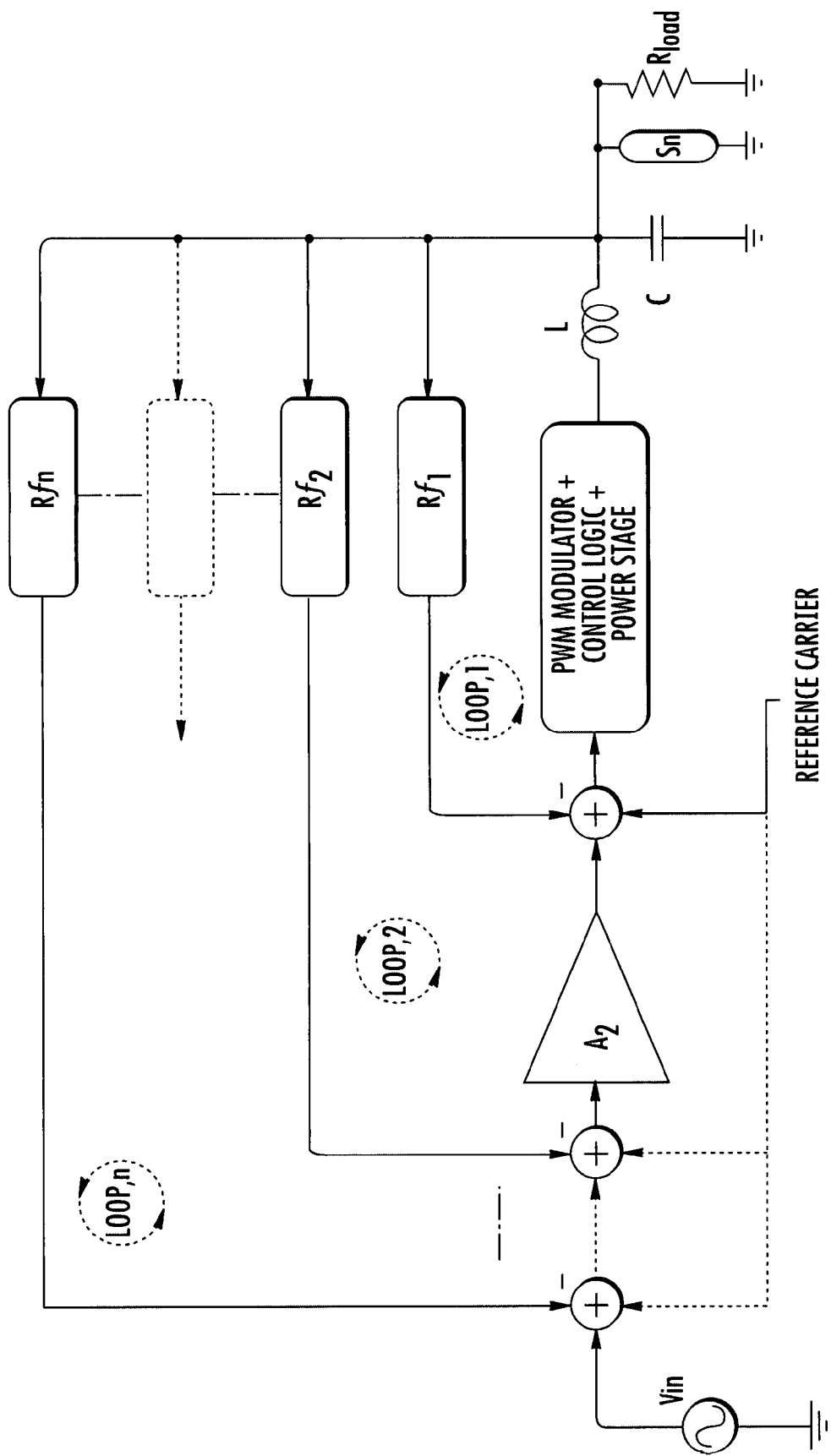
FIG. 4 is a block diagram of the proposed solution according to the invention.

FIG. 4 depicts an architecture of a device, including: a plurality of feedback paths of the load voltage downstream the reconstruction filter LC; and a fixed frequency clock that defines the frequency of the output PWM waveform. The stability of the distinct feedback loops, from the innermost with a transfer function of the loop gain $G_{loop,1}$, to the outermost with a transfer function $G_{loop,n}$, is analyzed herein below.

For better understanding of how the device works, that for simplicity of analysis is supposed linear, let us consider a circuit with only two loops. Moreover, let us assume that the feedback loop includes a passive network, described by the following transfer function:

$$Rf_1 = \frac{1+s\tau_1}{1+s\tau_2}$$

with $\tau_2 \ll \tau_1$ and $$\tau_1 = \frac{1}{2\pi f_T},$$

that the transfer function of the cascade composed of the low-pass filter and the load has two complex conjugated poles at a frequency $f_T$ and that the presence of the snubber network may be neglected.

Figure 5A:
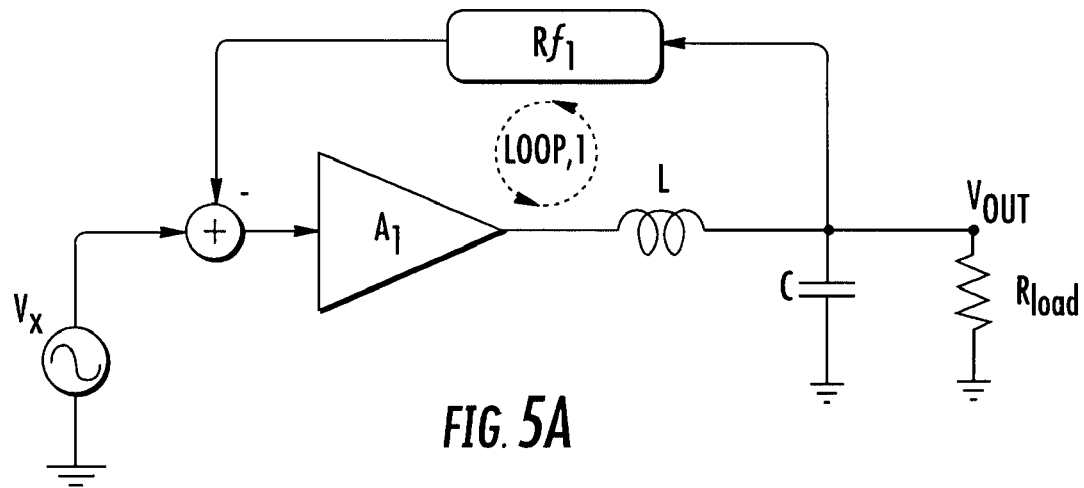
FIGS. 5a and 5b are respectively the linearized circuit of the internal loop and the diagram of the module of the loop gain according to the invention.
Figure 5B:
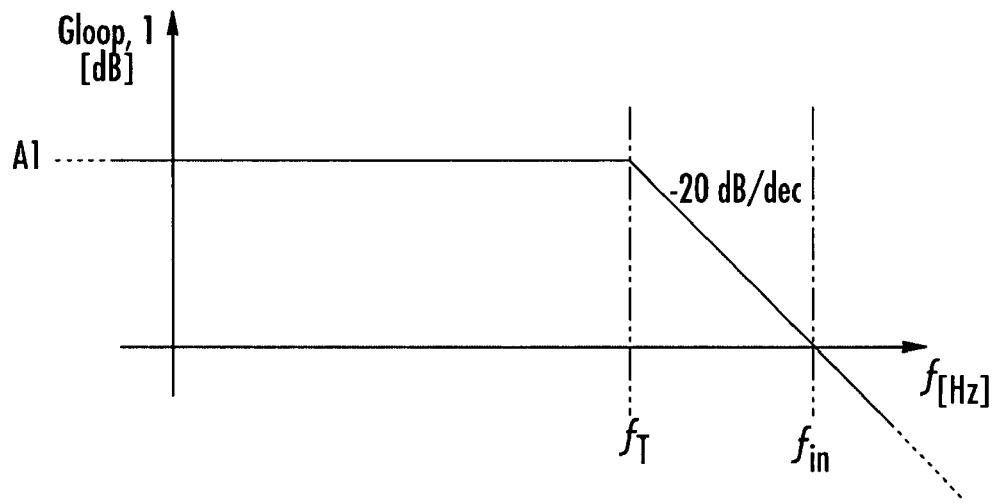
Figure 6:
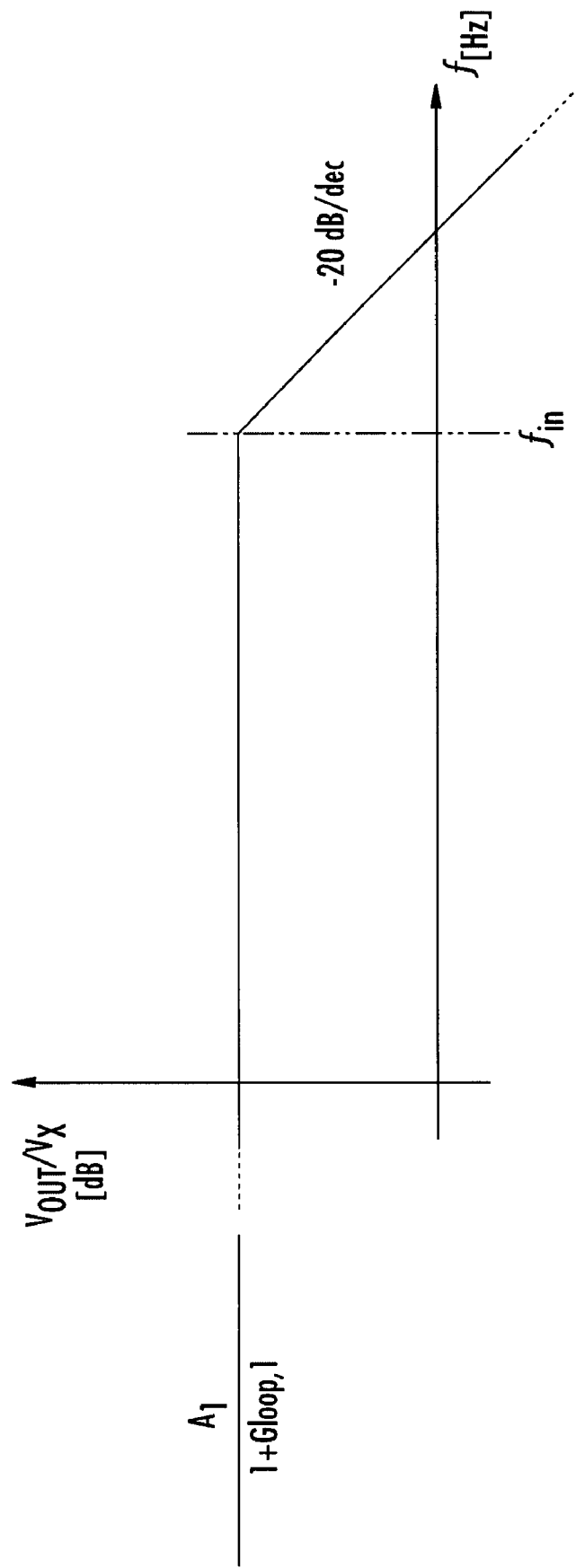
FIG. 6 is a Bode diagram of the transfer function $V_{out}/V_x$ according to the invention.

Considering only the innermost loop, shown in FIG. 5a, of this amplifier, one of the poles of $G_{loop,1}$ introduced by the LC low-pass filter is compensated by choosing the parameters that define the network $Rf_1$ introduced in the feedback loop, the transfer function of $G_{loop,1}$ as depicted in FIG. 5b and the transfer function of $$\frac{V_{out}}{V_x}$$

as shown in FIG. 6 are obtained. Compensation of the pole at a cut-off frequency $f_T$ is achieved by positioning at the same frequency a zero of the network (filter) introduced in the feedback path.

Figure 7A:
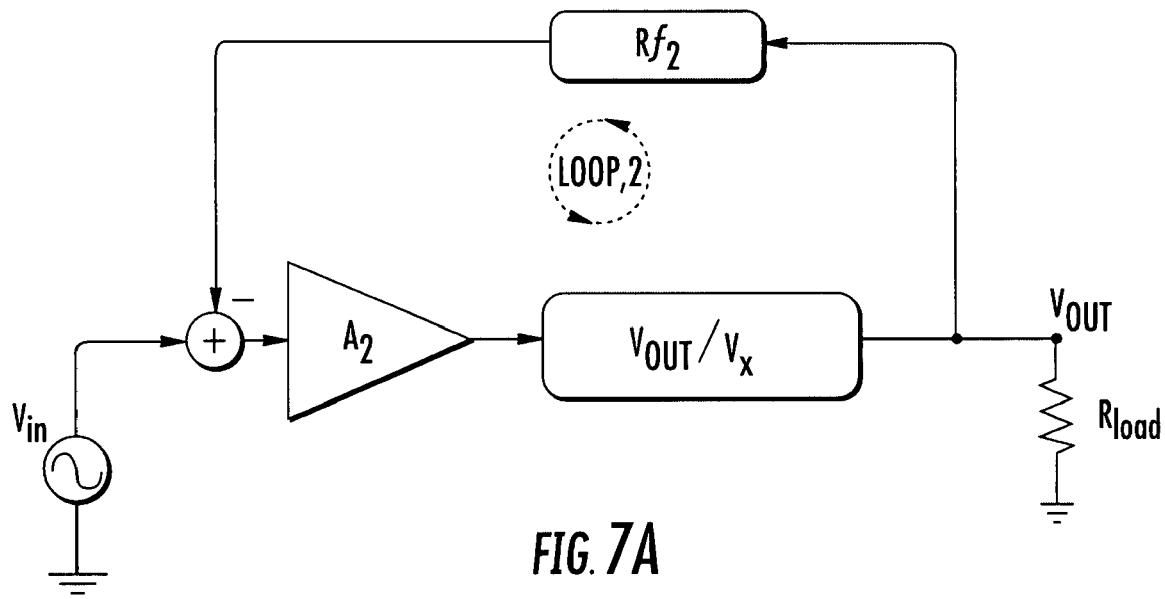
FIGS. 7a and 7b are respectively a block diagram of the external loop and the relative Bode diagram of the loop gain according to the invention.
Figure 7B:
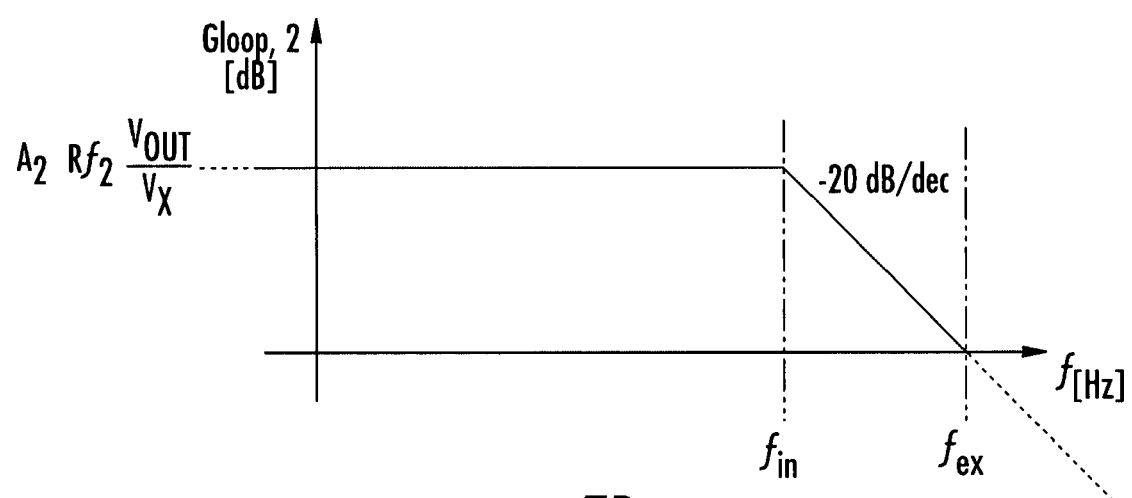

By substituting the inner loop with a block with a transfer function $$\frac{V_{out}}{V_x},$$

it is possible to obtain an equivalent system, depicted in FIG. 7a with a loop gain $G_{loop,2}$ having the transfer function of FIG. 7b, supposing that $$f_{ex} \ll \frac{1}{2\pi\tau_2}.$$

It is to be noticed that this transfer function is characterized by a single pole at a frequency $f_{in}$, that ensures the stability of the feedback system. By choosing the parameters that define the block $A_2$ and the network $Rf_2$ (typically, but may not be necessarily independent from the frequency) of the second loop, the overall gain and also the cut-off frequency $f_{ex}$ of the transfer function $$\frac{V_{out}}{V_{in}}$$

are determined and thus also the pass band of the feedback amplifier.

By optionally adding two further outer feedback paths (that is paths around the previously illustrated two loops) of the load voltage Vout, it is possible to vary (typically to increase) the cut-off frequency of the system or the overall loop gain of the device. Increasing the overall loop gain may be desirable because it provides a reduction of the distortion introduced by the system on the signal to be amplified.

Figure 8:
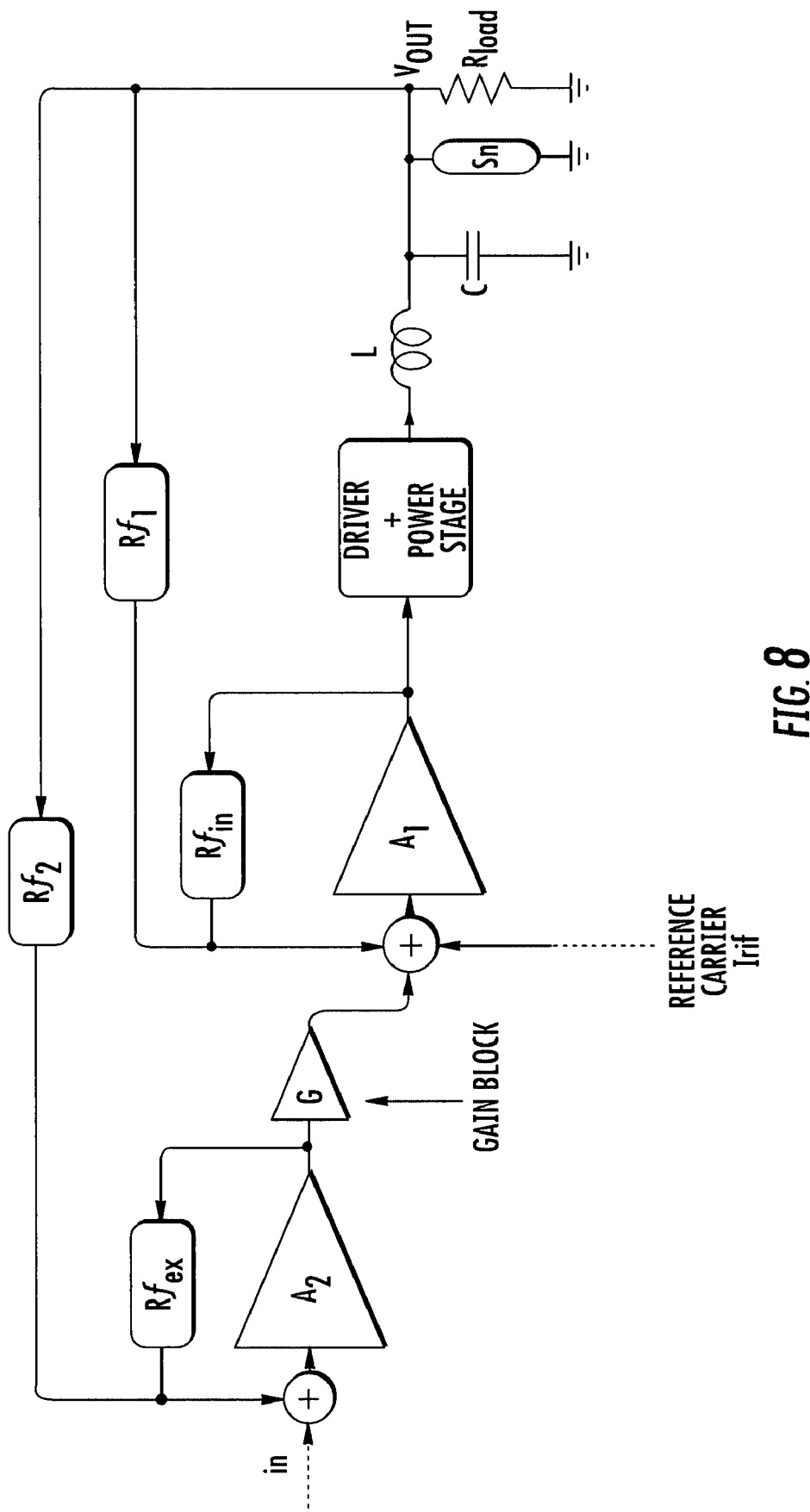
FIG. 8 is a block diagram of an embodiment of the invention.
Figure 9:
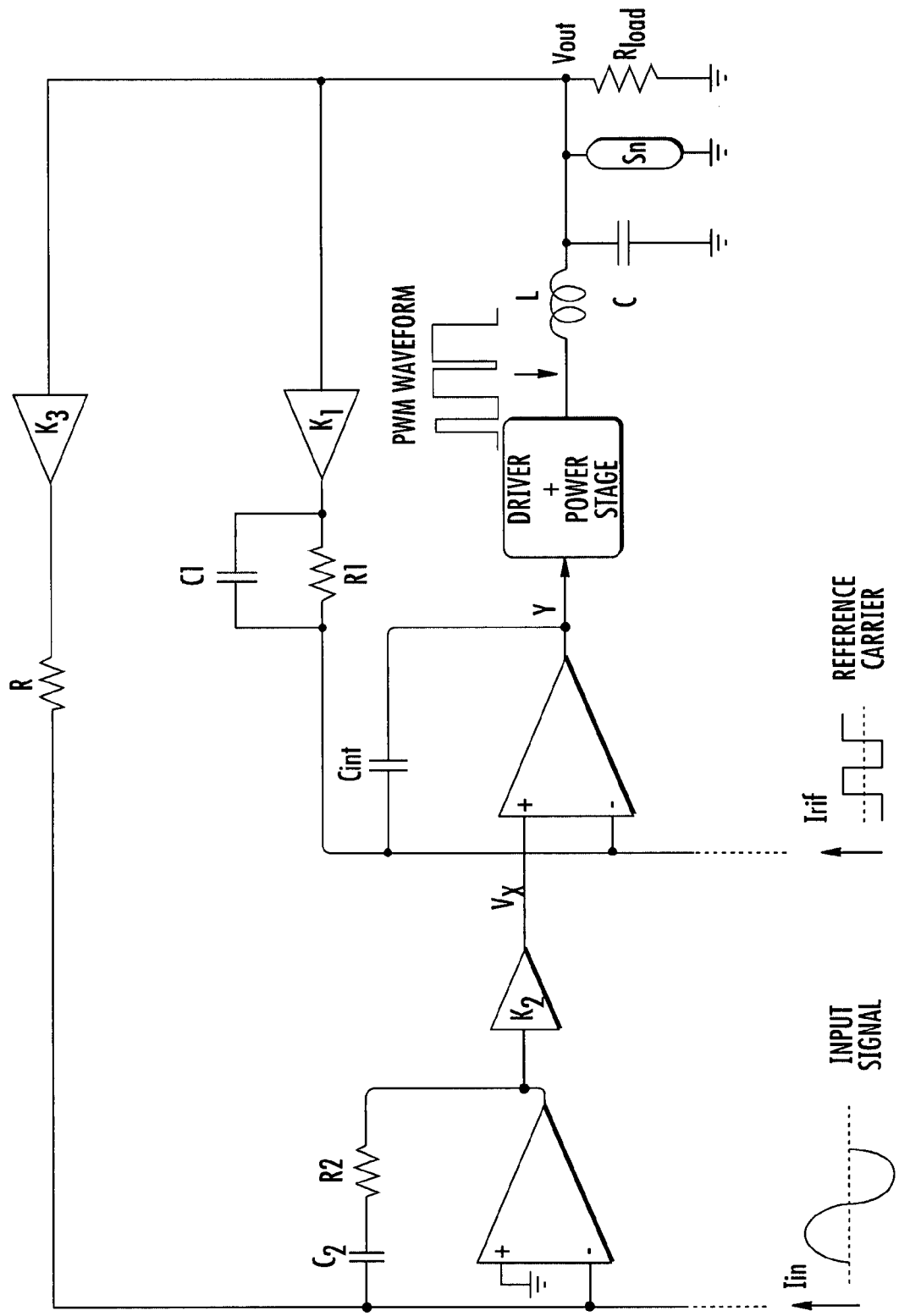
FIG. 9 is a block diagram of a second embodiment of the invention.

FIG. 8 depicts a prototype of an amplifier, in which two control loops of the load voltage Vout, the respective feedback paths of which include the networks $Rf_1$ and $Rf_2$, both fundamental for the stability of the system, while FIG. 9 depicts in a more detailed fashion the same circuit, with a current input ($I_{in}$). In general, the presence of only two feedback paths is sufficient for satisfactorily compensating the negative effects of the LC filter and obtaining a high loop gain.

Preferably, the reference carrier $I_{rif}$ is a square wave at a fixed frequency $f_c$, that may be fixed in a broad frequency range. The frequency $f_c$ should be chosen such to prevent possible interferences with devices operating in the same electromagnetic environment. The output of the power stage, immediately upstream the low-pass filter LC, is a PWM wave.

Using a square wave as a reference carrier instead of a triangular wave, as typically done in PWM modulators, at fixed frequency may be advantageous because a square waveform may be more easily generated than a triangular waveform. According to another embodiment, the reference carrier is provided in the feedback loop and it is added to at least a feedback signal provided by a respective feedback loop, that reduces sensitivity of the device in respect to the characteristics of the square wave reference current, thus the architecture is further simplified.

Figure 10:
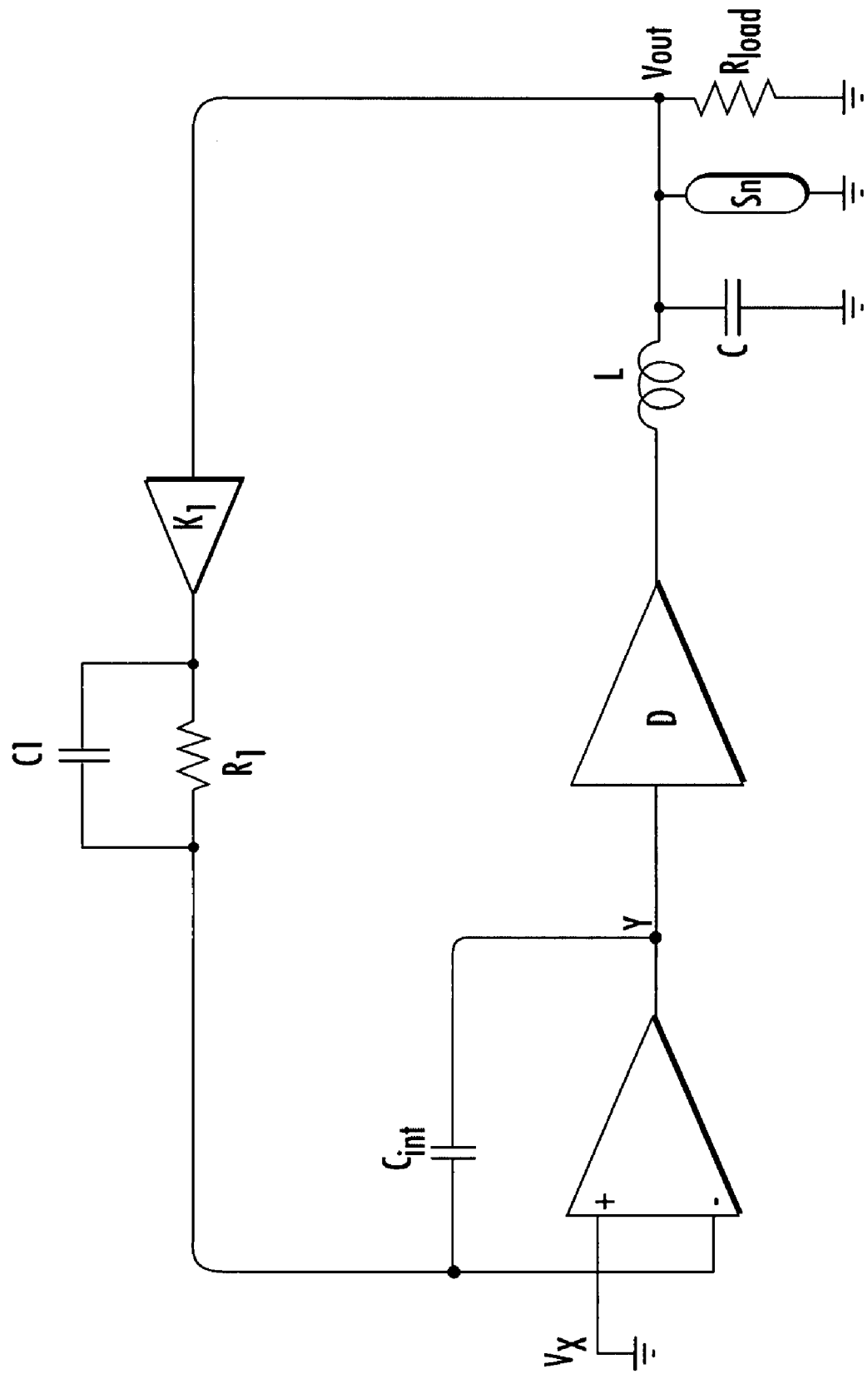
FIG. 10 is a detailed view of the internal loop of the circuit of FIG. 9.

For studying the stability of the system let us refer to FIG. 10, that depicts the equivalent circuit of the linearized internal loop. For linearizing the loop, a mathematical model involving the averages of the state variables (available in literature, for example in: R. D. Middlebrook—"*Small-Signal Modelling of Pulse Width Modulation Switched-Mode Power Converters*", Proceedings of the IEEE, Vol. 76, pp. 343-354, No. 4, April 1988) is used, the square wave carrier being integrated and a corresponding triangular wave being on the node Y. The equivalent gain of the cascade DRIVERS+POWER STAGE of FIG. 9 is indicated with D.

Figure 12A:
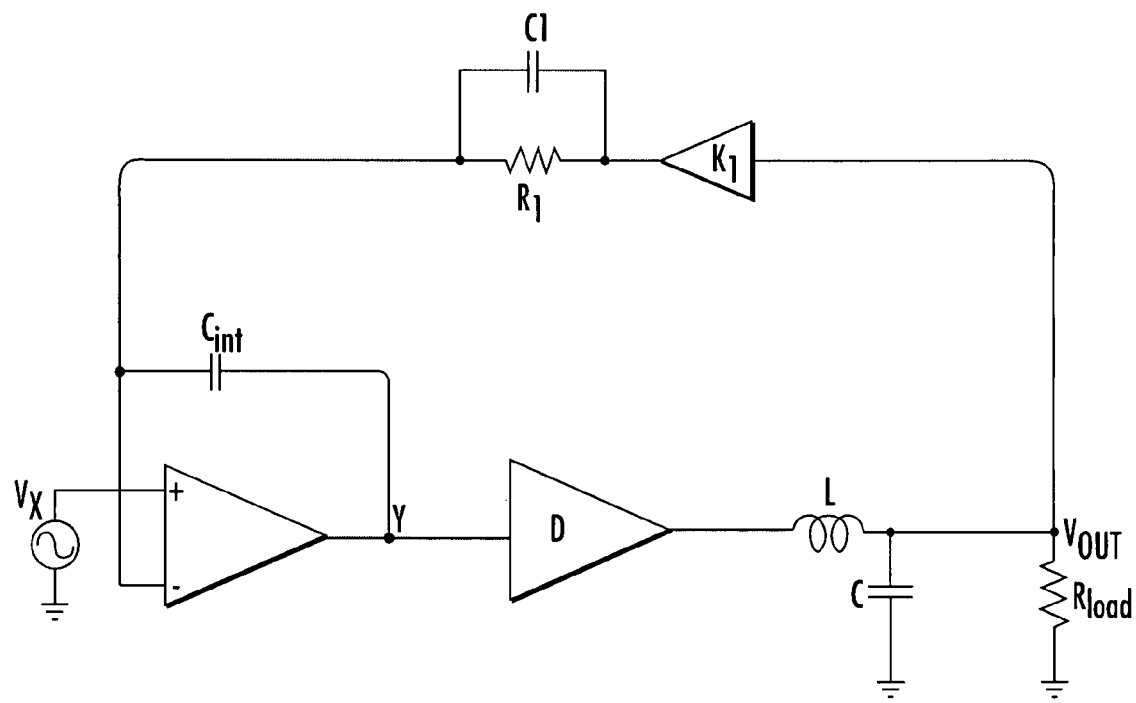
FIG. 12a is a detailed view of the internal loop of the circuit of FIG. 9 with a generator of an input signal $V_x$.

The block with gain $K_1$ introduced in the feedback loop allows attenuation of the feedback signal and may even be a simple resistive voltage divider. The pair $R_1$-$C_1$ introduces a zero at the frequency $f_T$ in the transfer function of the loop gain $G_{loop,in}$ of the inner loop, that compensates one of the poles introduced in the cascade of the low-pass filter+load (neglecting for sake of ease the effect of the snubber network, as shown in FIG. 12a). This condition makes the Bode diagram of the module of the loop gain $G_{loop,in}$ cross the axis at 0 dB with a slope no larger than -40 dB/dec. Tests demonstrated that, by properly choosing the various parameters, a phase margin sufficient to make stable the innermost loop can be obtained.

Figure 11:
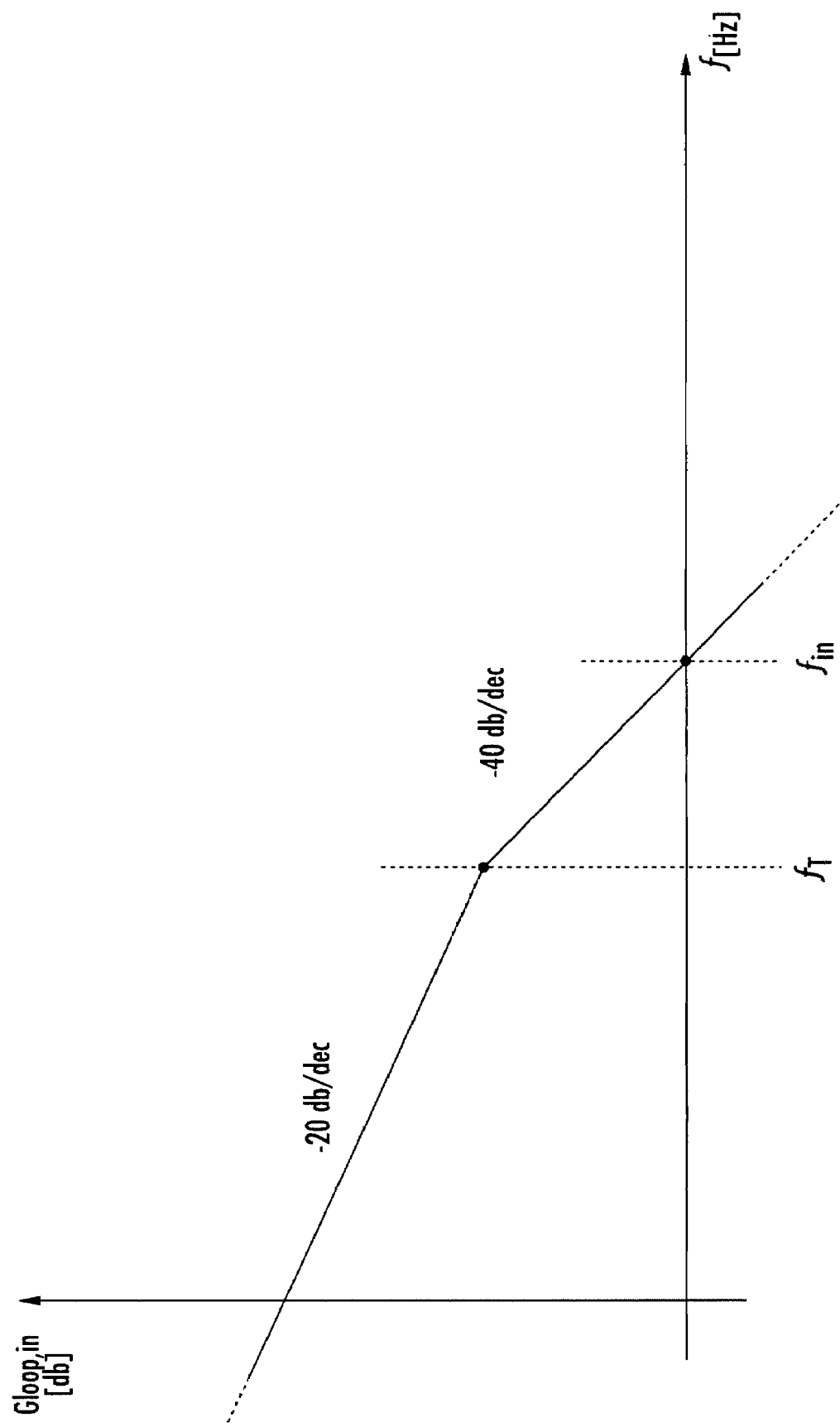
FIG. 11 is a Bode diagram of the module of the gain of the internal loop $G_{loop,in}$ of the circuit of FIG. 10.
Figure 12B:
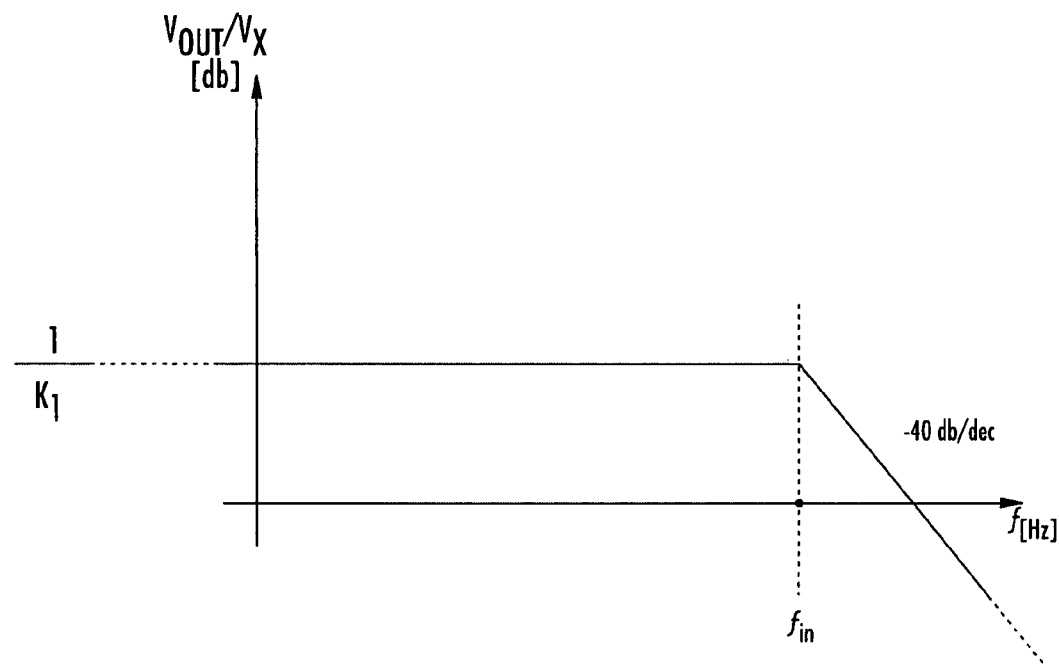
Figure 13:
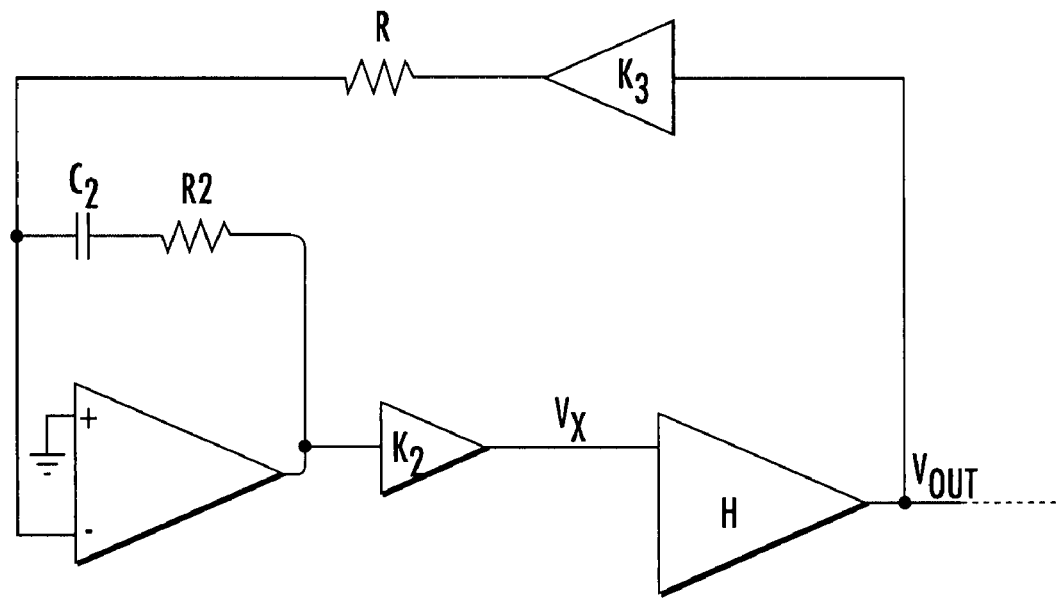
FIG. 13 shows schematically the outermost loop of the circuit of FIG. 9.

FIG. 11 depicts the Bode diagram of the module of the loop gain $G_{loop,in}$ while the frequency diagram of the transfer function $V_{out}/V_x$ is depicted in FIG. 12b. FIG. 13 schematically depicts the external loop of the system, with a loop gain $G_{loop,ex}$. The inner loop has been substituted with a block with a transfer function $H=V_{out}/V_x$. Preferably, the blocks with gain $K_2$ and $K_3$ are attenuators, simply made of resistive voltage dividers.

Figure 14:
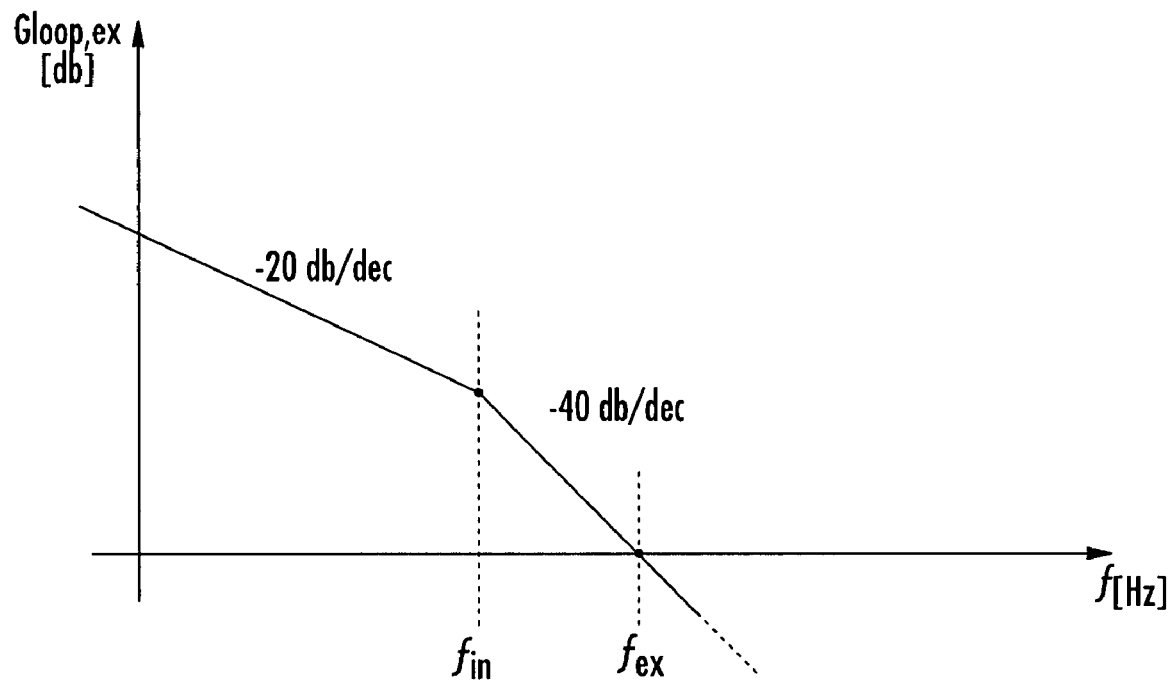
FIG. 14 is a Bode diagram of the gain of the loop of FIG. 13.

The resistor $R_2$ and the capacitor $C_2$ allow for compensation of a pole of the transfer function of the loop gain $G_{loop,ex}$ of the outer loop by introducing a zero at the frequency $f_{in}$, as shown by the Bode diagram of FIG. 14. Even in this case, the Bode diagram of the module for the loop gain $G_{loop,ex}$ crosses the axis at 0 dB with a slope not larger than -40 dB/dec, thus it is possible to obtain a phase margin sufficient for making stable the outermost loop by properly designing the parameters of the circuit.

The values of $K_3$ and R define the gain of the circuit and contribute to determine the band (equal to $f_{ex}$) of the feedback amplifier. The block $K_2$ allows shifting up or down the characteristic of the module of the loop gain $G_{loop,ex}$ thus allowing an optimization of the phase margin.

Moreover, by diminishing the gain $K_2$, it is possible to maintain the same loop gain $G_{loop,ex}$ by diminishing the capacitance $C_2$, thus reducing the silicon area used. This is highly desirable for integrating the device. Similarly, the gain $K_3$ allows for limiting the value of R, thus to reduce the relative silicon area used.

Among the advantages that this amplifier offers compared to known amplifiers are:

a) Compensation of Nonlinearity Introduced by the LC Filter:

Tests carried out on prototypes realized by the Applicant confirm that this device sensibly reduces nonlinearity of the low-pass demodulation filter, even by two orders of magnitude with only two feedback loops. This allows for reduction of the total harmonic distortion (THD) of the amplifier or alternatively for the same linearity performances, to use low cost reactive components.

b) Possibility of Reducing the Radiated Emission:

From the previous considerations emerges that the band B of the amplifier may be made independent from the cut-off frequency $f_T$ of the cascade low-pass filter+load. It is possible to obtain B≈20 kHz, even if $f_T$<20 kHz, thus, in respect to a traditional circuit architecture (that is with a demodulating filter external to the feedback loop), the proposed architecture allows for strong attenuation of the spectral components at high frequency of the amplified signal (that are inevitably present even after having filtered a PWM modulation signal).

Figure 15:
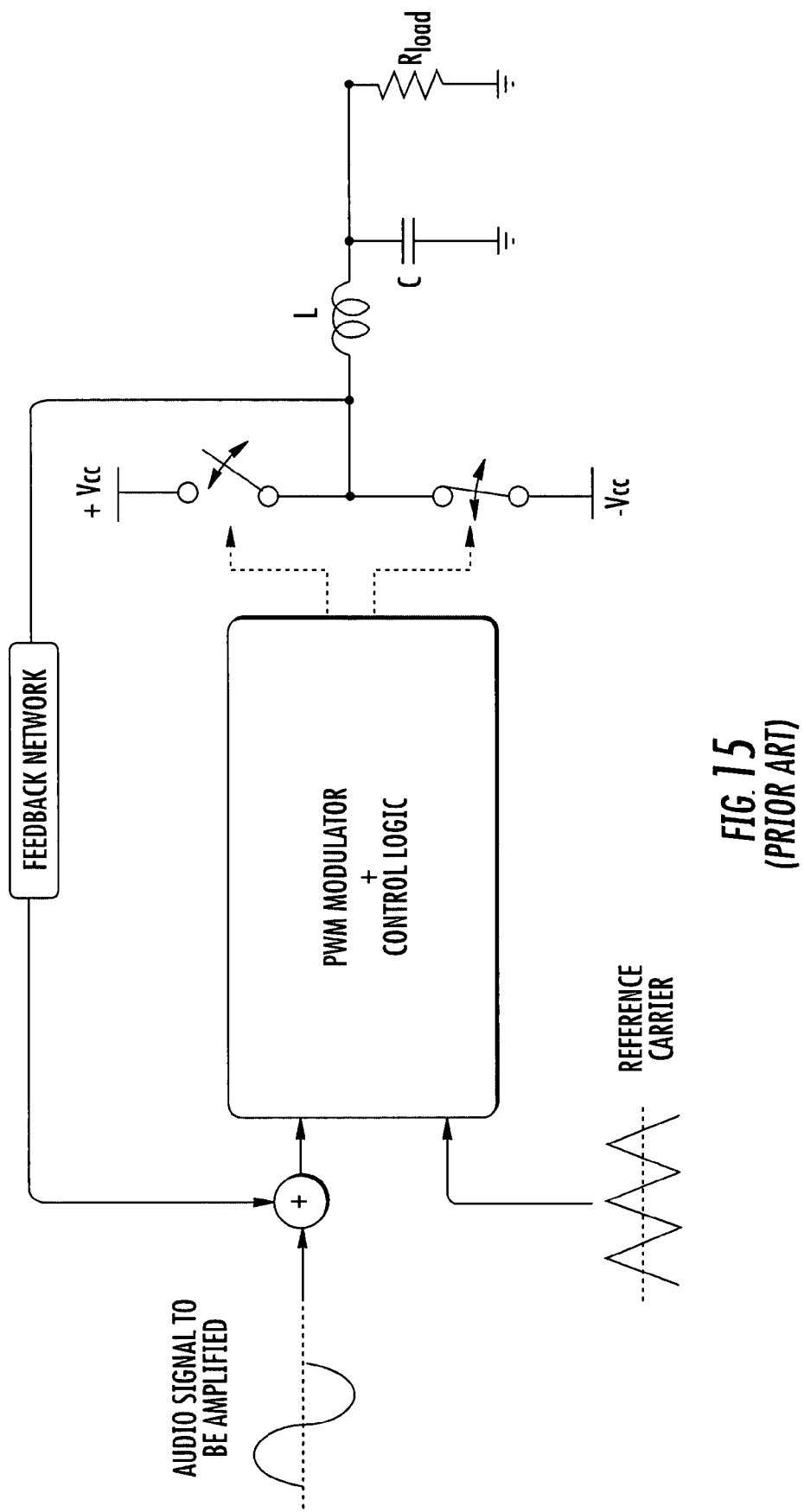
FIG. 15 shows a classic voltage switching amplifier with feedback of the output of the power stage according to the prior art.

Indeed, in the classical architecture of switching amplifier of FIG. 15 with feedback at the output of the power stage, it may be necessary to impose $f_T$≈B for having a band-pass of B≈20 kHz. By supposing that the frequency of the reference carrier is $f_c$=10 B, the main harmonic frequency of the carrier is attenuated on the load by about 40 dB in respect to the amplitude of the carrier output by the power stage.

By contrast, with the architecture of this amplifier, it is possible to obtain B≈20 kHz even imposing $$f_T \approx \frac{B}{10}.$$

This implies an attenuation of 80 dB of the amplitude of the first harmonic of the carrier (that could be obtained with a traditional solution only by employing a fourth-order filter).

Figure 16:
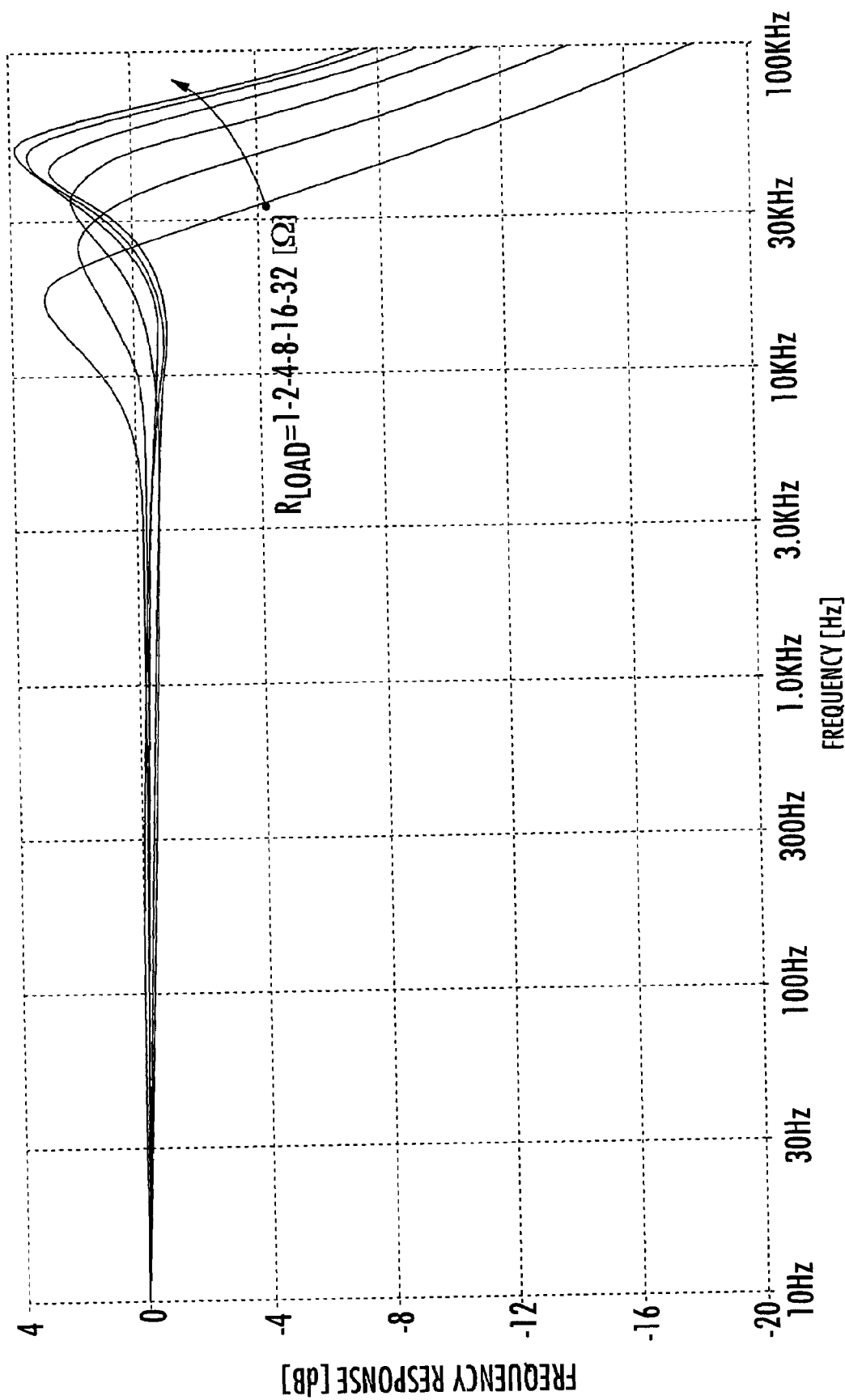
FIG. 16 is a diagram of the frequency response of the device of this invention of FIG. 9 for different values of the purely resistive load $R_{load}$ (with L=50 µH, C=1 µF).

It should be noticed that the Power Bandwidth (PB) of the amplifier (that is the bandwidth inside which it is possible to have an amplified output signal with the largest amplitude allowed by the supply voltage of the power stage) is in both cases limited by the frequency $f_T$. Therefore, by referring to the previous example, for this amplifier, there is a PB of about $$\frac{B}{10}$$

even if it is B≈20 kHz. This, in general, is not a problem because the energy content of an audio signal is concentrated at the low frequencies of the audible band.

c) Control of the Frequency Response:

The fact that the low-pass filter LC is inside the feedback loop ensures that the amplifier has a direct control of the amplified signal applied to the loudspeaker, without interposing elements connected in series or in parallel that may modify the frequency response. FIG. 16 shows a sample frequency response on purely resistive loads, obtained with this amplifier as depicted in FIG. 9 by using the same filtering components used for the simulation of FIG. 2.

Figure 1:
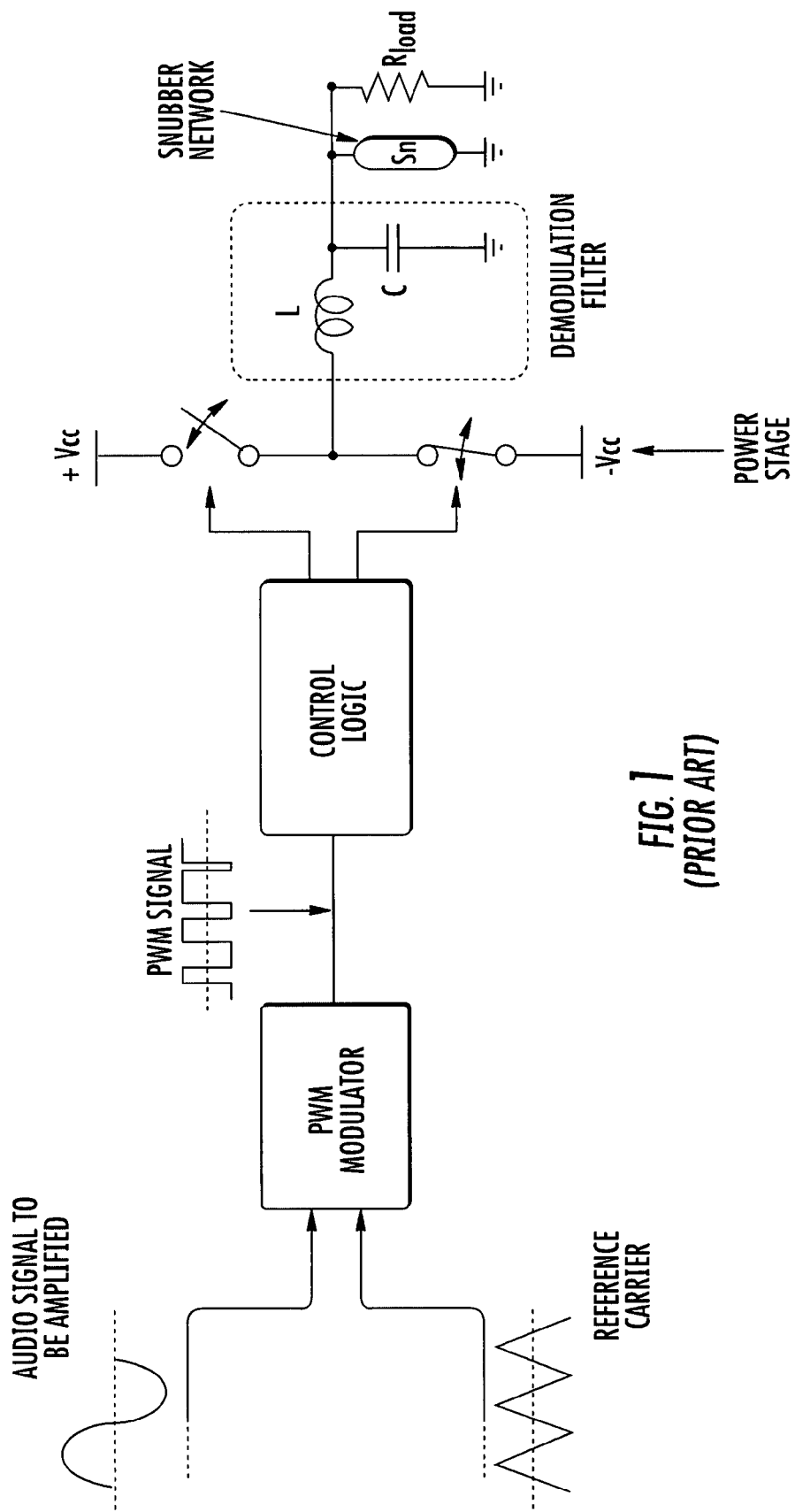
FIG. 1 illustrates schematically the functioning principle of a switching amplifier according to the prior art.
Figure 2:
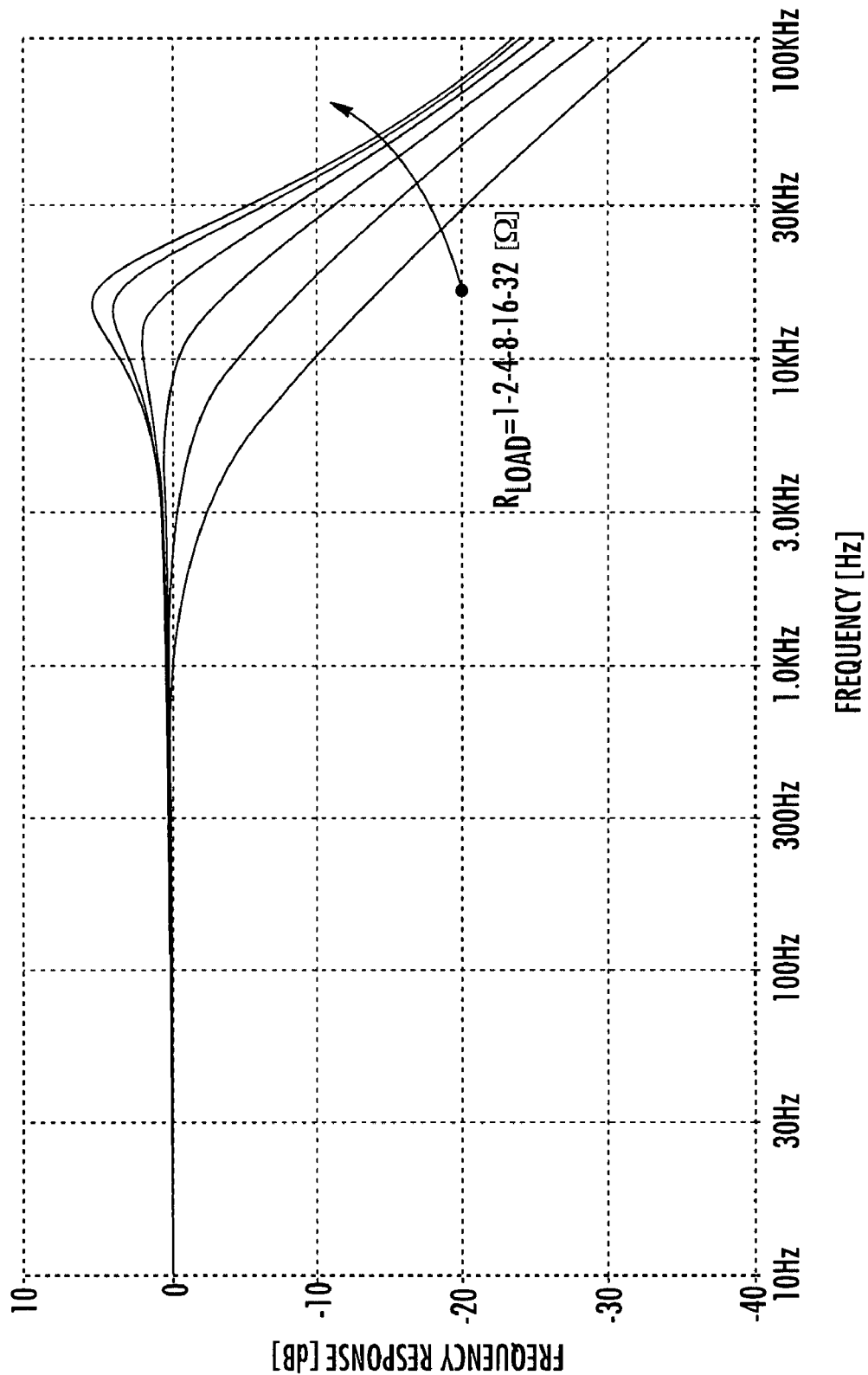
FIG. 2 shows the frequency response of the cascade low-pass filter+load+snubber network for different values of the purely resistive load $R_{load}$ (with L=50 µH, C=1 µF) according to the prior art.
Figure 3:
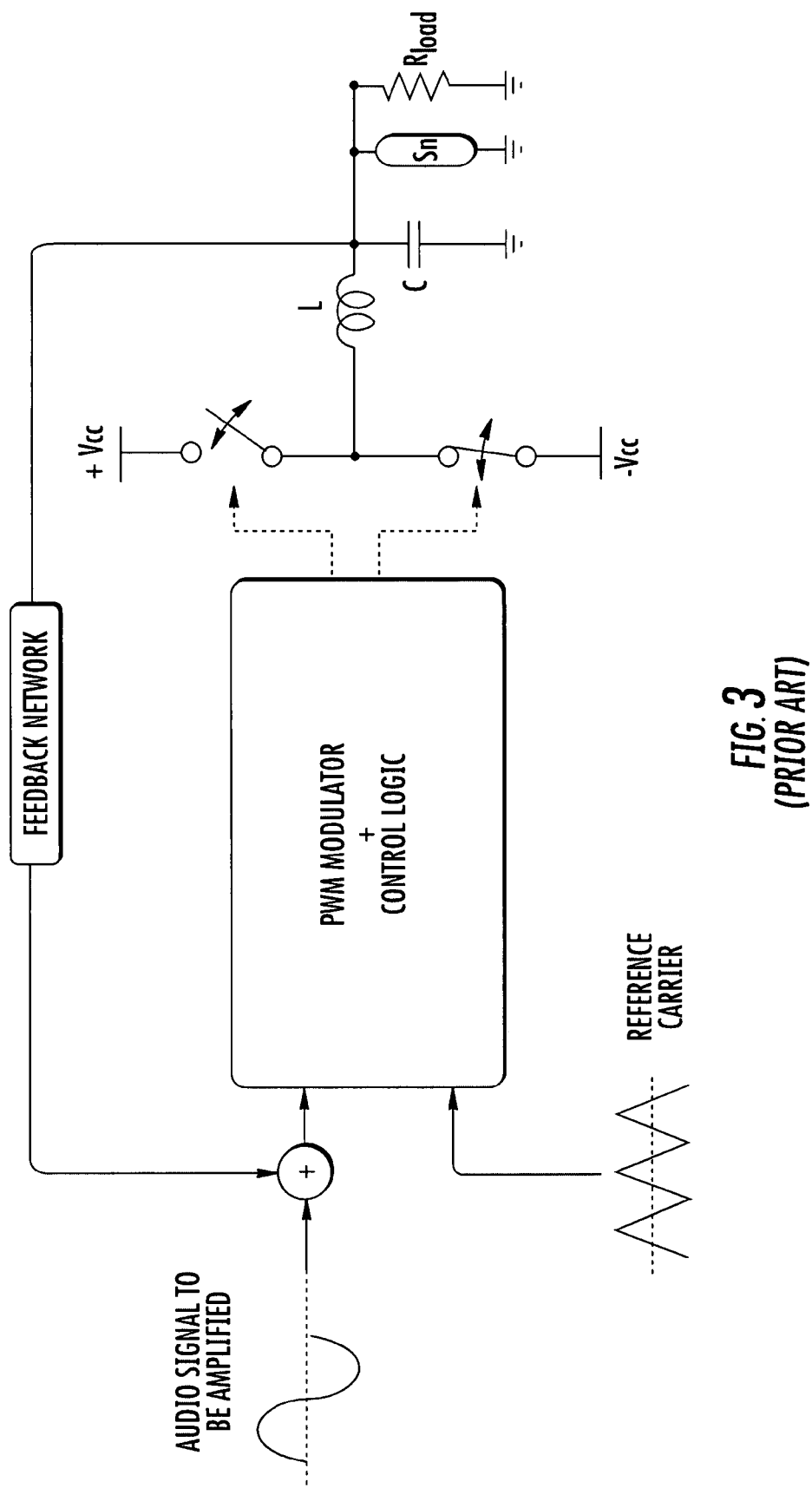
FIG. 3 shows an example of a system feedback with a filter inside the feedback loop according to the prior art.

By comparing the Bode's diagrams of FIG. 16 and FIG. 2 it is immediately recognized that this amplifier has a pass band much larger than that of the classic amplifier of FIG. 1 and has a practically flat frequency response in the audible band because the frequency poles of the amplifier are positioned outside the audible band. This amplifier is characterized by a frequency response in the audible band that may be substantially independent from the supplied load and it is the more regular the larger the overall loop gain in this frequency band is.

That which is claimed is:

1. A signal amplifier comprising:
a class D amplifier generating a modulated voltage signal switching as a function of an intermediate signal;
a low-pass filter input with the modulated voltage signal for applying a filtered replica of the modulated voltage signal to a load;
a plurality of feedback paths for generating a plurality of feedback signals of the filtered replica; and
a circuit input with the plurality of feedback signals of the filtered replica and a signal to be amplified and generating the intermediate signal as a combination of the plurality of feedback signals, the signal to be amplified, and an externally generated reference carrier;
said plurality of feedback paths including respective feedback filters, each feedback filter for compensating a respective frequency pole of a transfer function of a cascade of the low-pass filter with the load and for establishing at least one band pass of the signal amplifier.

2. The signal amplifier of claim 1 wherein at least one of the feedback filters establishes a parameter of the transfer function, the parameter being at least one of a phase margin, a cut-off frequency, a total harmonic distortion, a loop gain, and a gain of the signal amplifier.

3. The signal amplifier of claim claim 1 wherein the externally generated reference carrier comprises a square wave signal.

4. The signal amplifier of claim 1 wherein each feedback filter comprises a passive network.

5. A signal amplifier comprising:
an amplifier generating a modulated signal based upon an intermediate signal;
a filter having an input coupled to the modulated signal, and an output coupled to a load;
a plurality of feedback paths coupled to the output of said filter; and
a circuit coupled to said plurality of feedback paths for generating the intermediate signal based upon a combination of an input signal, outputs of said plurality of feedback paths, and a reference signal;
said plurality of feedback paths including respective feedback filters, each feedback filter for compensating a respective frequency pole of a transfer function of said filter coupled to the load.

6. The signal amplifier of claim 5 wherein said amplifier comprises a class D amplifier.

7. The signal amplifier of claim 5 wherein at least one of the feedback filters establishes a parameter of the transfer function, the parameter being at least one of a phase margin, a cut-off frequency, a total harmonic distortion, a loop gain, and a gain of the signal amplifier.

8. The signal amplifier of claim 5 wherein each feedback filter comprises a passive network.

9. A method for making a signal amplifier comprising an amplifier generating a modulated signal based upon an intermediate signal, and a filter having an input coupled to the modulated signal and an output coupled to a load, the method comprising:
coupling a plurality of feedback paths to the output of the filter; and
coupling an input of a circuit with the plurality of feedback paths for generating the intermediate signal based upon a combination of an input signal, outputs of the plurality of feedback paths, and a reference signal;
the plurality of feedback paths including respective feedback filters, each feedback filter for compensating a respective frequency pole of a transfer function of the filter coupled to the load.

10. The method of claim 9 wherein the amplifier comprises a class D amplifier.

11. The method of claim 9 wherein at least one of the feedback filters establishes a parameter of the transfer function, the parameter being at least one of a phase margin, a cut-off frequency, a total harmonic distortion, a loop gain, and a gain of the signal amplifier.

12. The method of claim 9 wherein each feedback filter comprises a passive network.

* * * * *

UNITED STATES PATENT AND TRADEMARK OFFICE
CERTIFICATE OF CORRECTION

PATENT NO. : 7,541,869 B2  Page 1 of 1
APPLICATION NO. : 11/692597
DATED : June 2, 2009
INVENTOR(S) : Adduci et al.

It is certified that error appears in the above-identified patent and that said Letters Patent is hereby corrected as shown below:

Column 2, Line 41    Delete: "feedback loop,"
                     Insert: -- feedback loop. --

Column 2, Line 46    Delete: "Convention, 2000"
                     Insert: -- Convention, 2002 --

Column 8, Line 4     Delete: "of claim claim 1"
Claim 3              Insert: -- of claim 1 --

Signed and Sealed this

Fifteenth Day of September, 2009

David J. Kappos
*Director of the United States Patent and Trademark Office*